United States Patent [19]

Kimura

[11] Patent Number: 5,171,714
[45] Date of Patent: Dec. 15, 1992

[54] METHOD OF MANUFACTURING A SEMICONDUCTOR DEVICE HAVING INTERCONNETION PATTERNS

[75] Inventor: Daisuke Kimura, Nara, Japan

[73] Assignee: Sharp Kabushiki Kaisha, Osaka, Japan

[21] Appl. No.: 867,736

[22] Filed: Apr. 13, 1992

[30] Foreign Application Priority Data

Apr. 15, 1991 [JP] Japan ............................ 3-82117

[51] Int. Cl.[5] ................ H01L 21/31; H01L 21/283
[52] U.S. Cl. .................................. 437/195; 437/40; 437/69; 437/186; 437/228; 156/657
[58] Field of Search .............. 437/40, 41, 50, 69, 437/73, 186, 193, 195, 228, 239, 985, 225, 984, 72; 357/65; 156/657; 748/DIG. 20

[56] References Cited

U.S. PATENT DOCUMENTS

| | | | |
|---|---|---|---|
| 4,352,238 | 10/1982 | Shimbo | 437/186 |
| 4,717,689 | 1/1988 | Maas et al. | 437/225 |
| 4,812,418 | 3/1989 | Pfiester et al. | 437/69 |
| 5,028,559 | 7/1991 | Zdebel et al. | 437/69 |

FOREIGN PATENT DOCUMENTS 2-284471 11/1990 Japan.
2111304 6/1983 United Kingdom ................ 437/72

*Primary Examiner*—T. N. Quach
*Attorney, Agent, or Firm*—Nixon & Vanderhye

[57] ABSTRACT

A method of manufacturing a semiconductor device is disclosed which may form a very minute interconnection pattern having line width less than that of an interconnection pattern formed by a photolithography technique. In the method of manufacturing a semiconductor device, after patterning by a photolithography technique polysilicon layer 3a and nitride layer 4a laminated in order on semiconductor silicon substrate 1, an oxide film is formed in a self-alignment manner in the polysilicon layer by thermal oxidation treatment at a high temperature and a nitride film is removed by etching back the whole surface. The polysilicon layer is divided into two by carrying out etching with the oxide film used as mask. It is possible to form two interconnection patterns in the space for one interconnection pattern formed by a photolithography technique using such a manufacturing method.

7 Claims, 8 Drawing Sheets

METHOD OF MANUFACTURING A SEMICONDUCTOR DEVICE HAVING INTERCONNETION PATTERNS

BACKGROUND OF THE INVENTION

1. Field of the Invention

The present invention relates to a method of manufacturing a semiconductor device, and more particularly, to a method of manufacturing a semiconductor device having an interconnection pattern formed on a semiconductor substrate using a photolithography method.

2. Description of the Background Art

A photolithography method is conventionally known as a method of forming an interconnection pattern to which the gate electrode and the like of a transistor formed on a semiconductor substrate are connected. FIG. 1 is a plan layout diagram of a semiconductor device having an interconnection pattern to which the gate electrode of a conventional transistor is connected. FIG. 2 is a perspective view of a conventional semiconductor device shown in FIG. 1.

Referring to FIGS. 1 and 2, a semiconductor device having a conventional interconnection pattern is provided with a semiconductor silicon substrate 101, an element isolation film (an LOCOS film) 102 formed in a predetermined region on the main surface of semiconductor silicon substrate 101 for isolating elements, a pair of interconnection patterns 131 and 132 formed to extend in a predetermined direction at a predetermined space on the surface of element isolation film 102, oxide films (SiO$_2$ films) 133 and 134 formed to cover interconnection patterns 131 and 132 and each having an opening in the center of the top surface of interconnection patterns 131 and 132, a gate electrode 108a formed to cover a predetermined region on an active region 110a surrounded by element isolation film 102 and interconnection pattern 131, and a gate electrode 108b formed to cover a predetermined region on an active region 110b and interconnection pattern 132. Gate electrode 108a and interconnection pattern 131 are electrically connected through a contact hole of oxide film 133. Gate electrode 108b and interconnection pattern 132 are electrically connected through a contact hole of oxide film 134.

FIGS. 3 to 9 show cross-sectional views for explaining a manufacturing process (the first step to the seventh step) of a conventional semiconductor device shown in FIG. 2. Referring to FIGS. 2 to 9, the manufacturing process of a conventional semiconductor device will now be described.

First, as shown in FIG. 3, isolation oxide film 102 is formed in a predetermined region on semiconductor silicon substrate 101 using an LOCOS method. A polysilicon layer 130, which is an interconnection material, is formed on the whole surface of the film.

Next, as shown in FIG. 4, organic resists 140 are formed in a predetermined region on polysilicon layer 130 using a photolithography method. Polysilicon layer 130 is anisotropically etched with organic resists 140 used as mask.

As shown in FIG. 5, a pair of interconnection patterns 131, 132 having a predetermined space therebetween are formed.

Next, as shown in FIG. 6, oxide films (SiO$_2$ films) 133a and 134a are formed to cover interconnection patterns 131 and 132, respectively. Organic resists 150 are formed on a region excluding the centers of the top surfaces of interconnection patterns 131 and 132. Oxide films 133a and 134a positioned on the centers of the top surfaces of interconnection patterns 131 and 132, respectively, are removed by carrying out anisotropical etching with organic resists 150 used as mask.

As shown in FIG. 7, oxide films 133 and 134 are formed which have an opening on the centers of top surfaces of interconnection patterns 131 and 132, respectively. A polysilicon layer 108 of a predetermined thickness is formed on the whole surface.

Next, as shown in FIG. 8, organic resists 160 are formed on a region having the gate electrode formed. The region is anisotropically etched with organic resists 160 used as mask.

As a result, as shown in FIG. 9, gate electrode 108a connected to interconnection pattern 131 and gate electrode 108b connected to interconnection pattern 132 are formed. In this way, a semiconductor device having an interconnection pattern to which the gate electrode and the like of a conventional transistor are connected is formed.

However, line width of interconnection patterns 131, 132 can only be miniaturized to be approximately the same as that of gate electrodes 108a, 108b in such a conventional manufacturing method of interconnection patterns 131, 132. More specifically, the minimum values of line width of gate electrodes 108a, 108b and line width of interconnection patterns 131, 132 are determined depending on the limit of processing in a photolithography technique. When semiconductor devices are more miniaturized as they are integrated in a larger scale, line width of gate electrodes 108a, 108b is miniaturized to the limit of processing in a photolithography method. Taking into consideration integration in a larger scale of interconnection patterns 131, 132, it is necessary to miniaturize the line width. However, it was not possible to have line width of interconnection patterns 131, 132 miniaturized to be less than the limit of processing in a photolithography method in a conventional method of forming interconnection patterns 131, 132. In other words, it was not possible to have line width of interconnection patterns 131, 132 miniaturized to be less than that of gate electrodes 108a, 108b. This has posed a problem in an attempt of integration of a semiconductor device (LSI) in a larger scale.

SUMMARY OF THE INVENTION

One object of the present invention is to form a very minute interconnection pattern having line width less than that of an interconnection pattern formed using a conventional photolithography technique in a method of manufacturing a semiconductor device.

Another object of the present invention is to form easily an interconnection pattern having line width less than that of an interconnection pattern formed using a conventional photolithography technique in a method of manufacturing a semiconductor device.

In brief, in one aspect of the present invention, a manufacturing method of a semiconductor device is a method of manufacturing a semiconductor device having an interconnection pattern formed on a semiconductor substrate using a photolithography method, including the steps of forming an interconnection material layer including silicon on a semiconductor substrate and an oxidation resistance layer thereon; patterning the interconnection material layer and the oxidation resistance layer by a photolithography method; forming by thermal oxidation treatment an oxide film on an area of the top surface of the patterned interconnection material layer, excluding the center portion along a predetermined direction of the same; removing the oxidation resistance layer by etching the whole surface; and forming a pair of first and second interconnection patterns by removing with the oxide film used as mask the center portion along a predetermined direction of the patterned interconnection material layer.

In operation, an oxide film is formed by thermal oxidation treatment on an area of the top surface of the patterned interconnection material layer, excluding the center portion along a predetermined direction of the same; the center portion along a predetermined direction of the patterned interconnection material layer is removed with the oxide film used as mask after removing an oxide resistance layer; and a pair of first and second interconnection patterns are formed. As a result, a pair of interconnection patterns are provided using line width for one interconnection pattern formed by a conventional photolithography method.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention will be described hereinafter in conjunction with the drawings.

Figure 10:
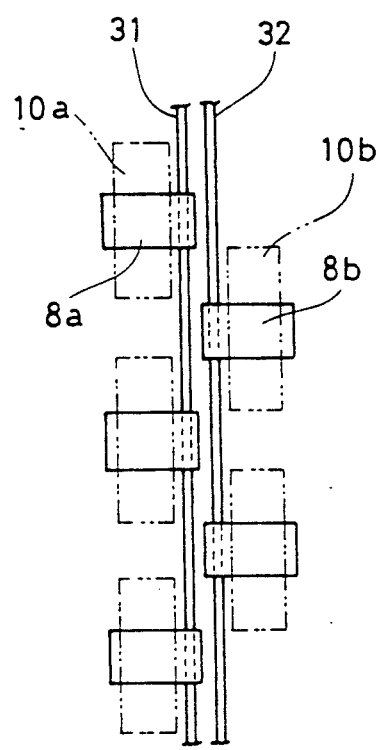
FIG. 10 is a plan layout diagram of a semiconductor device according to one embodiment of the present invention.
Figure 11:
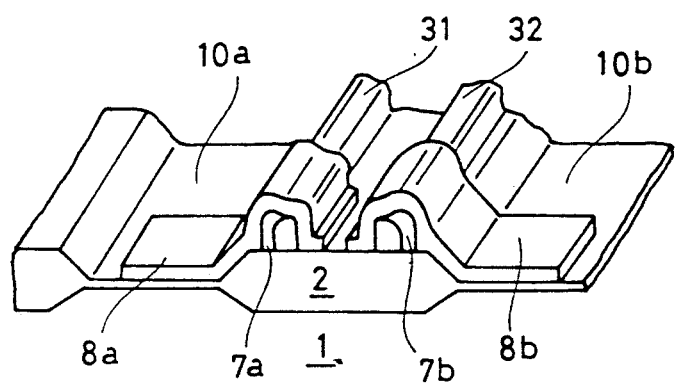
FIG. 11 is a perspective view of a semiconductor device shown in FIG. 10.

Referring to FIGS. 10 and 11, description will be made on structure of a semiconductor device formed by a method of manufacturing a semiconductor device according to the embodiment of the present invention.

Figure 1:
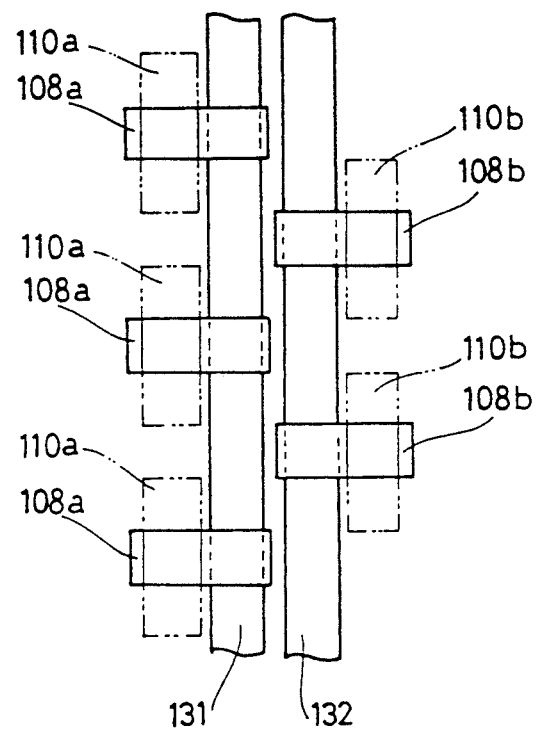
FIG. 1 is a plan layout diagram of a semiconductor device having an interconnection pattern to which the gate electrode of a conventional transistor is connected.
Figure 2:
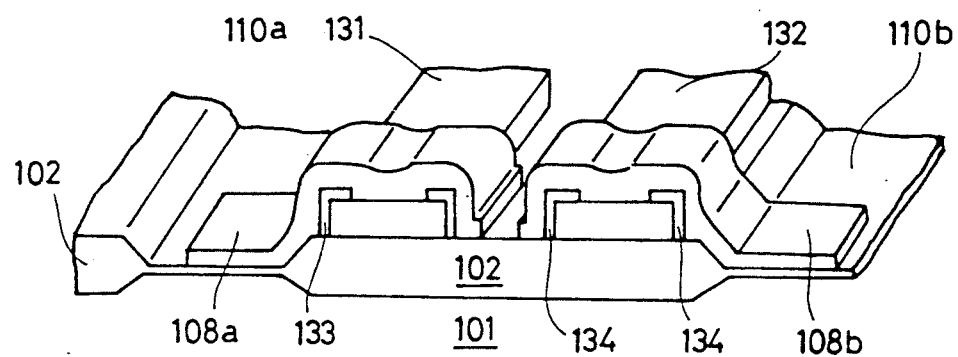
FIG. 2 is a perspective view of a conventional semiconductor device shown in FIG. 1.
Figure 3:
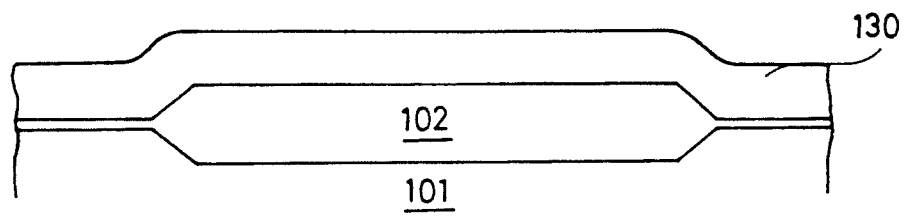
FIG. 3 is a cross-sectional view for explaining the first step of a manufacturing process of the conventional semiconductor device shown in FIG. 2.
Figure 4:
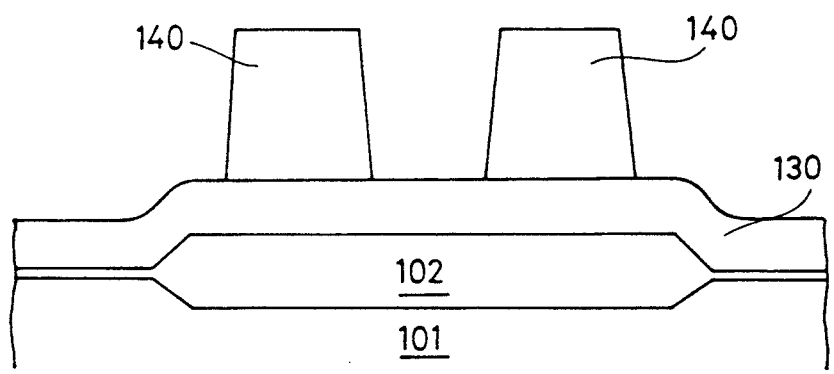
FIG. 4 is a cross-sectional view for explaining the second step of the manufacturing process of the conventional semiconductor device shown in FIG. 2.
Figure 5:
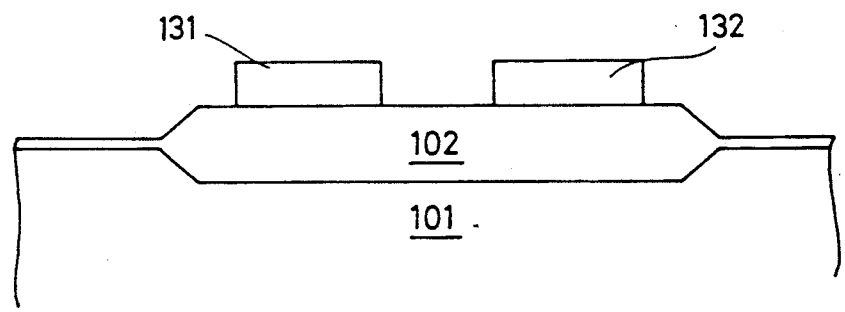
FIG. 5 is a cross-sectional view for explaining the third step of the manufacturing process of the conventional semiconductor device shown in FIG. 2.
Figure 6:
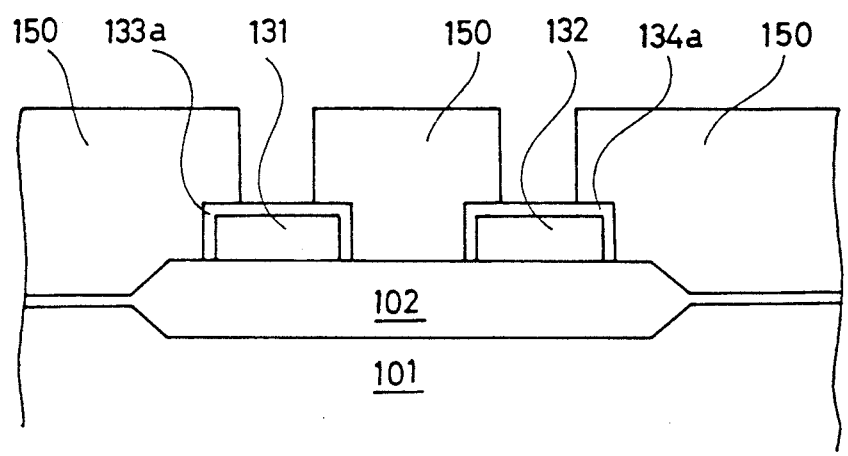
FIG. 6 is a cross-sectional view for explaining the fourth step of the manufacturing process of the conventional semiconductor device shown in FIG. 2.
Figure 7:
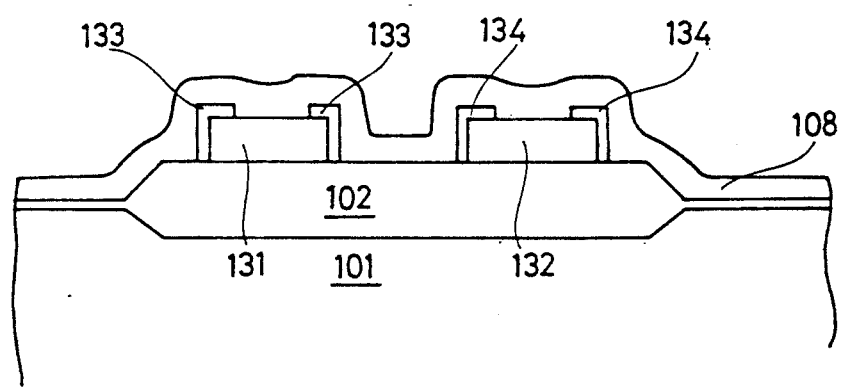
FIG. 7 is a cross-sectional view for explaining the fifth step of the manufacturing process of the conventional semiconductor device shown in FIG. 2.
Figure 8:
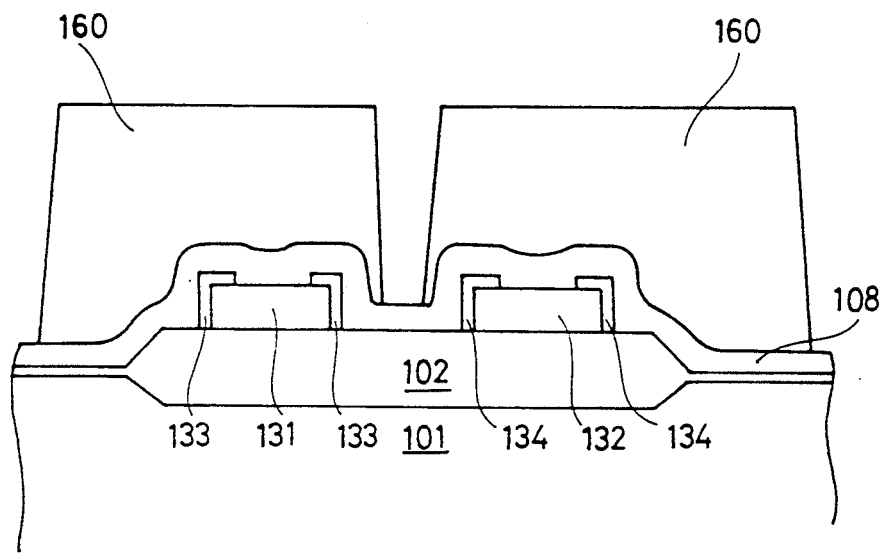
FIG. 8 is a cross-sectional view for explaining the sixth step of the manufacturing process of the conventional semiconductor device shown in FIG. 2.
Figure 9:
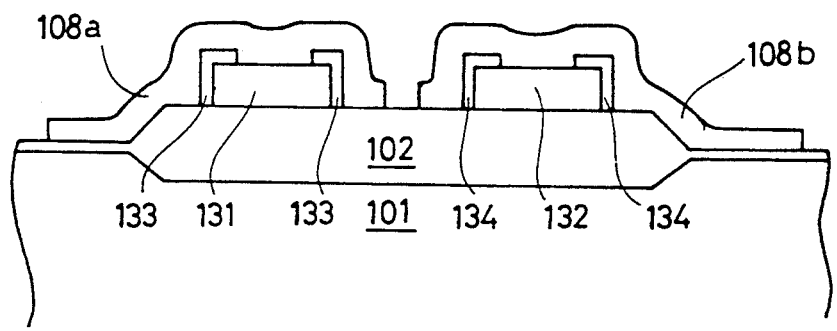
FIG. 9 is a cross-sectional view for explaining the seventh step of the manufacturing process of the conventional semiconductor device shown in FIG. 2.

A semiconductor device according to the embodiment is provided with a semiconductor silicon substrate 1, an element isolation film (an LOCOS film) 2 formed in a predetermined region on the main surface of semiconductor silicon substrate 1 for isolating elements, a pair of interconnection patterns 31, 32 formed on element isolation film 2 to extend along a predetermined direction at a predetermined space, an oxide film (an $SiO_2$ film) 7a formed on a side wall at the side of active region 10a of interconnection pattern 31, an oxide film (an $SiO_2$ film) 7b formed on a side wall at the side of active region 10b of interconnection pattern 32, a gate electrode 8a electrically connected to interconnection pattern 31 and formed to cover interconnection pattern 31 as well as to extend to active region 10a, and a gate electrode 8b electrically connected to interconnection pattern 32 and formed to cover interconnection pattern 32 as well as to extend to active region 10b. The distance from a side end at the side of active region 10a of interconnection pattern 31 to a side end at the side of active region 10b of interconnection pattern 32 is approximately the same as line width of one conventional interconnection pattern 131, shown in FIG. 2. Therefore, compared with a semiconductor device shown in FIG. 2 having interconnection patterns 131, 132 formed using a conventional photolithography method, it is possible to be more integrated in a larger scale in a semiconductor device according to the embodiment shown in FIG. 11.

Referring to FIGS. 12 to 18, description will be made on a manufacturing process (the first process to the seventh process) of a semiconductor device according to the embodiment of the present invention.

Figure 12:
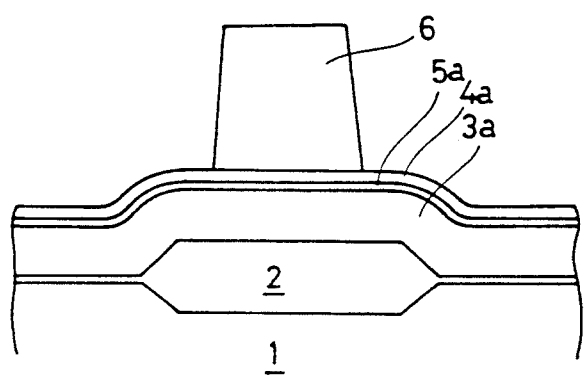
FIG. 12 is a cross-sectional view for explaining the first step of a manufacturing process of the semiconductor device shown in FIG. 11.
Figure 13:
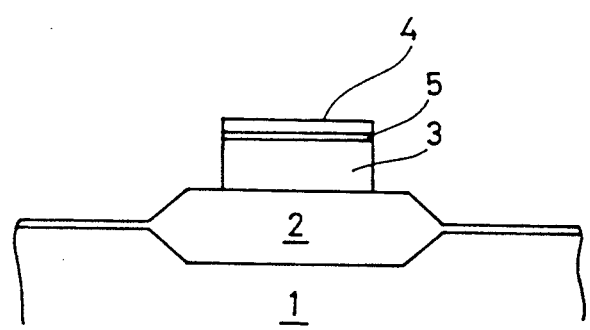
FIG. 13 is a cross-sectional view for explaining the second step of the manufacturing process of the semiconductor device shown in FIG. 11.

First, as shown in FIG. 12, element isolation film 2 is formed in a predetermined region on semiconductor silicon substrate 1 using an LOCOS method. A polysilicon layer 3a which is to be a structural material of an interconnection pattern is formed on the whole surface of the film. An $SiO_2$ layer 5a is formed on polysilicon layer 3a. An SiN (Silicon Nitride) layer 4a is formed on $SiO_2$ layer 5a. An organic resist 6 is formed only on a portion corresponding to an interconnection pattern to be formed. After patterning SiN layer 4a, $SiO_2$ layer 5a and polysilicon layer 3a by carrying out anisotropic etching (dry etching) with organic resist 6 used as mask, organic resist 6 is removed. As a result, SiN layer 4, SiO$_2$ layer 5 and polysilicon layer 3 patterned as shown in FIG. 13 are obtained.

Figure 14:
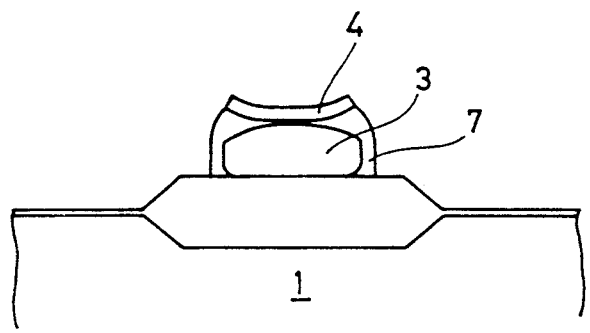
FIG. 14 is a cross-sectional view for explaining the third step of the manufacturing process of the semiconductor device shown in FIG. 11.

Next, as shown in FIG. 14, semiconductor silicon substrate 1 is thermally oxidized at a high temperature using a furnace tube (not shown). According to this thermal treatment, SiO$_2$ layer 7 is formed on both side walls of polysilicon layer 3. At the same time, SiO$_2$ layer 7 grows also between polysilicon layer 3 and SiN layer 4 to make both ends of SiN layer 4 curved upwards.

Figure 15:
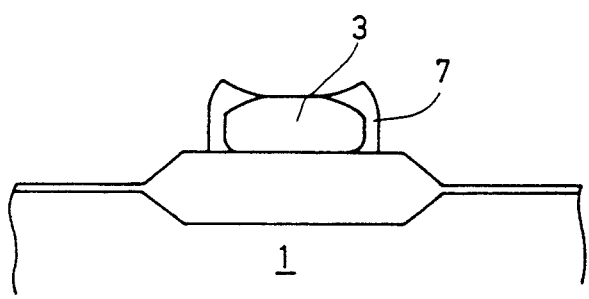
FIG. 15 is a cross-sectional view for explaining the fourth step of the manufacturing process of the semiconductor device shown in FIG. 11.

Next, as shown in FIG. 15, after completing thermal treatment, SiN layer 4 is removed by etching back the whole surface using a dry etching method. As a result, the center portion along the direction in which the pattern is to be extended of polysilicon layer 3 is exposed with the width kept uniform. After removing SiN layer 4 completely by etching back the whole surface, the surface layer of SiO$_2$ layer 7 is also slightly removed. Therefore, a thin portion of SiO$_2$ film 7 on the surface of polysilicon layer 3 (SiO$_2$ layer 7 positioned beneath a portion where SiN layer 4 is a little curved) is removed. As a result, the surface of polysilicon layer 3 corresponding to the removed portion thereof is exposed.

Figure 16:
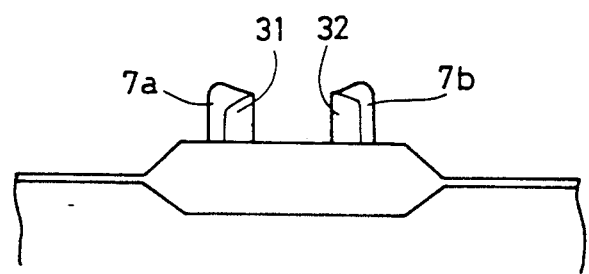
FIG. 16 is a cross-sectional view for explaining the fifth step of the manufacturing process of the semiconductor device shown in FIG. 11.

Next, as shown in FIG. 16, the above-described exposed portion of polysilicon layer 3 is removed by carrying out dry etching (anisotropic etching) with SiO$_2$ layer 7 used as mask. As a result, two interconnection patterns 31 and 32 are formed which divide polysilicon layer 3 (cf. FIG. 15) into two. The distance from an end at the side of SiO$_2$ layer 7$a$ of interconnection pattern 31 to an end at the side of SiO$_2$ layer 7$b$ of interconnection pattern 32 is approximately the same as line width of one conventional interconnection pattern 131 shown in FIG. 2 as mentioned before. As a result, it is possible to make an interconnection pattern more integrated compared with a conventional semiconductor device shown in FIG. 2, thereby to make LSI integrated in a larger scale.

Figure 17:
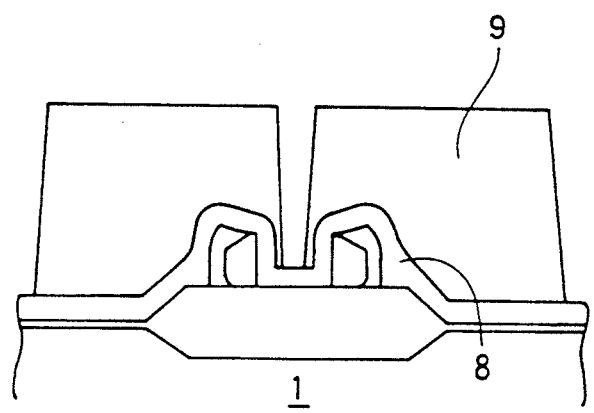
FIG. 17 is a cross-sectional view for explaining the sixth step of the manufacturing process of the semiconductor device shown in FIG. 11.
Figure 18:
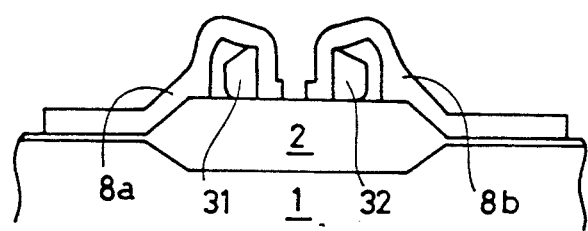
FIG. 18 is a cross-sectional view for explaining the seventh step of the manufacturing process of the semiconductor device shown in FIG. 11.

Next, as shown in FIG. 17, a polysilicon layer 8 as a gate electrode material is formed on the whole surface. After forming an organic resist layer on the whole surface, by patterning it, an organic resist 9 is formed only on a portion where the gate electrode is to be formed. By carrying out dry etching (anisotropic etching) with organic resist 9 used as mask, an unnecessary portion is removed from polysilicon layer 8. As a result, a form as shown in FIG. 18 is obtained. In other words, gate electrode 8$a$ connected to interconnection pattern 31 and gate electrode 8$b$ connected to interconnection pattern 32 are formed.

As described above, gate electrodes 8$a$, 8$b$ and interconnection patterns 31, 32 thereof are formed separately in a method of manufacturing a semiconductor device according to the embodiment. Interconnection patterns 31, 32 are formed by forming a predetermined pattern using a photolithography technique before division of the pattern into two. Therefore, as shown in FIG. 11, it is possible to form interconnection patterns 31 and 32 for active regions 10$a$ and 10$b$, respectively, formed in two columns as shown in FIG. 11 in a space approximately the same as line width of gate electrode 8$a$ or 8$b$. As a result, it is possible to reduce the interconnection space (the distance between active regions 10$a$ and 10$b$) to approximately one half compared with a conventional interconnection space. This makes it possible to further enhance degree of integration of LSI.

In the embodiment described above, SiO$_2$ layer 5 is laminated on polysilicon layer 3. However, since the SiO$_2$ layer is provided to assist self-alignment in thermal oxidation treatment of polysilicon layer 3 at a high temperature, it is possible to implement a method of manufacturing a semiconductor device according to the present invention without provision of SiO$_2$ layer 5. Although polysilicon is used as an interconnection material in this embodiment, silicide such as MoSi$_2$, WSi$_2$ or TiSi$_2$ may be used in place of polysilicon in the present invention. It is also possible to achieve a manufacturing method of the present invention by using other nitride in place of SiN layer formed on an interconnection material layer. A method of manufacturing a semiconductor device according to the present invention is also applicable to formation of interconnection to other portions of a semiconductor device in addition to interconnection to the gate electrode portion.

As described above, the method of manufacturing a semiconductor device according to the present invention comprises the steps of: forming an interconnection material layer including silicon on a semiconductor substrate and an oxidation resistance layer thereon; forming an interconnection pattern extending in a predetermined direction by patterning the interconnection material layer and the oxidation resistance layer using a photolithography method; forming by thermal oxidation treatment an oxide film on an area of the top surface of the patterned interconnection material layer, excluding the center portion along a predetermined direction of the same; removing the oxidation resistance layer by etching the whole surface; removing with the oxide film used as mask the center portion along a predetermined direction within the patterned interconnection material layer; and forming a pair of first and second interconnection patterns. Accordingly, it becomes possible to form two interconnection patterns using a space for one conventional interconnection pattern formed by a photolithography technique, thereby making it possible to form very minute interconnection exceeding the limit of processing in a photolithography technique. As a result, it is possible to, for example, design LSI in a larger scale.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device having an interconnection pattern formed on a semiconductor substrate using a photolithography method, comprising the steps of:

forming an interconnection material layer including silicon on said semiconductor substrate and an oxidation resistance layer thereon;

patterning said interconnection material layer and said oxidation resistance layer by said photolithography method;

forming by thermal oxidation treatment an oxide film on an area of the top surface of the patterned interconnection material layer, excluding the center portion along a predetermined direction of the same;

removing said oxidation resistance layer by etching the whole surface;

forming a pair of first and second interconnection patterns by removing with said oxide film used as mask the center portion along said predetermined direction within said patterned interconnection material layer.

2. A method of manufacturing a semiconductor device according to claim 1, wherein
said interconnection material layer including the silicon is a polysilicon layer.

3. A method of manufacturing a semiconductor device according to claim 1, wherein
said interconnection material layer including the silicon is a silicide layer.

4. A method of manufacturing a semiconductor device according to claim 1, wherein
said oxidation resistance layer is a nitride layer.

5. A method of manufacturing a semiconductor device according to claim 4, wherein
said nitride layer is a silicon nitride layer.

6. A method of manufacturing a semiconductor device according to claim 1, wherein
said step of forming the interconnection material layer including the silicon on the semiconductor substrate and the oxidation resistance layer thereon comprises the step of forming the interconnection layer including the silicon on the semiconductor substrate with an oxide film formed thereon, followed by formation of the oxidation resistance layer on the oxide film.

7. A method of manufacturing a semiconductor device according to claim 1, wherein
first and second gate electrodes connected to said first and second interconnection patterns, respectively, are further formed after having said pair of first and second interconnection patterns formed.

* * * * *